United States Patent

Galan et al.

[11] Patent Number: 5,923,566
[45] Date of Patent: Jul. 13, 1999

[54] PHASE SHIFTED DESIGN VERIFICATION ROUTINE

[75] Inventors: Gerald Galan, Brignoud, France; Ioana C. Graur, Poughkeepsie; Lars W. Liebmann, Poughquag, both of N.Y.

[73] Assignee: International Business Machines Corporation, Armonk, N.Y.

[21] Appl. No.: 08/823,576

[22] Filed: Mar. 25, 1997

[51] Int. Cl.[6] ............................ G06F 17/00; G06F 17/50
[52] U.S. Cl. ............................ 364/489; 430/5; 430/311; 430/322
[58] Field of Search ............................ 364/488, 489, 364/490, 491; 430/5, 22, 311; 345/500

[56] References Cited

U.S. PATENT DOCUMENTS

| 5,537,648 | 7/1996 | Liebmann et al. | 395/500 |
|---|---|---|---|
| 5,538,815 | 7/1996 | Oi et al. | 430/5 |
| 5,538,833 | 7/1996 | Ferguson et al. | 430/325 |
| 5,553,274 | 9/1996 | Liebmann et al. | 395/500 |
| 5,671,152 | 9/1997 | Lavin et al. | 364/490 |
| 5,674,647 | 10/1997 | Isao et al. | 460/5 |
| 5,702,848 | 12/1997 | Spence | 430/5 |
| 5,766,804 | 6/1998 | Spence | 430/5 |
| 5,795,685 | 8/1998 | Liebmann et al. | 430/5 |
| 5,807,649 | 9/1998 | Liebmann et al. | 430/5 |

*Primary Examiner*—Kevin J. Teska
*Assistant Examiner*—Vuthe Siek
*Attorney, Agent, or Firm*—Whitham, Curtis & Whitham; H. Daniel Schnurmann

[57] ABSTRACT

A computer-implemented routine that verifies that an existing chip design can be converted to a PSM or reports localized design conflicts based solely on a knowledge of the specific design constraints applied in the targeted PSM design system and without a prior knowledge of specific layout configurations that will cause PSM design errors.

8 Claims, 7 Drawing Sheets

PHASE SHIFTED DESIGN VERIFICATION ROUTINE

BACKGROUND OF THE INVENTION

1. Field of the Invention

The present invention generally relates to the manufacture of very large scale integrated (VLSI) circuits and, more particularly, to the resolution enhancement of photolithographic images through the use of phase shifted masks. More specifically, a routine is provided to check a design for phase shiftability.

2. Description of the Related Art

A very large scale integrated (VLSI) complementary metal oxide semiconductor (CMOS) chip is manufactured on a silicon wafer by a sequence of material additions (i.e., low pressure chemical vapor depositions, sputtering operations, etc.), material removals (i.e., wet etches, reactive ion etches, etc.), and material modifications (i.e., oxidations, ion implants, etc.). These physical and chemical operations interact with the entire wafer. For example, if a wafer is placed into an acid bath, the entire surface of the wafer will be etched away. In order to build very small electrically active devices on the wafer, the impact of these operations has to be confined to small, well defined regions.

Lithography in the context of VLSI manufacturing of CMOS devices is the process of patterning openings in photosensitive polymers (sometimes referred to as photoresists or resists) which define small areas in which the silicon base material is modified by a specific operation in a sequence of processing steps. The manufacturing of CMOS chips involves the repeated patterning of photoresist, followed by an etch, implant, deposition, or other operation, and ending in the removal of the expended photoresist to make way for a new resist to be applied for another iteration of this process sequence.

The basic lithography system consists of a light source, a stencil or photomask containing the pattern to be transferred to the wafer, a collection of lenses, and a means for aligning existing patterns on the wafer with patterns on the mask. Since a wafer containing from fifty to one hundred chips is patterned in steps of one to four chips at a time, these lithography tools are commonly referred to as steppers. The resolution of an optical projection system such as a lithography stepper is limited by parameters described in Rayleigh's equation:

$$R = k_1 \lambda / NA, \quad (1)$$

where $\lambda$ is the wavelength (in $\mu$m) of the light source used in the projection system and NA is the numerical aperture of the projection optics used. $k_1$ is a factor describing how well a combined lithography system can utilize the theoretical resolution limit in practice and it can range from 0.8 down to 0.5 for standard exposure systems. R is the resolution value for the optical projection system. The highest resolution in optical lithography is currently achieved with deep ultra violet (DUV) steppers operating at 248 nm wavelengths but mid ultra violet (MUV) steppers with a wavelength of 356 nm are also in widespread use.

Manufacture of semiconductor devices is dependent upon the accurate replication of computer aided design (CAD) generated patterns onto the surface of device substrate. The replication process is typically performed using optical lithography followed by a variety of subtractive (etch) and additive (deposition) processes. Optical lithography patterning involves the illumination of a metallic coated quartz plate known as a photomask which contains a magnified image of the computer generated pattern etched into the metallic layer. This illuminated image is reduced in size and patterned into a photosensitive film on the device substrate.

Conventional photomasks consists of chromium patterns on a quartz plate, allowing light to pass wherever the chromium is removed from the mask. Light of a specific wavelength is projected through the mask onto the photoresist coated wafer, exposing the resist wherever hole patterns are placed on the mask. Exposing the resist to light of the appropriate wavelength causes modifications in the molecular structure of the resist polymers which allows developer to dissolve and remove the resist in the exposed areas. Negative resist systems allow only unexposed resist to be developed away. The photomask, when illuminated, can be pictured as an array of individual, infinitely small light sources which can be either turned on (points in clear areas) or turned off (points covered by chrome). If the amplitude of the electric field vector which describes the light radiated by these individual light sources is mapped across a cross section of the mask, a step function will be plotted reflecting the two possible states that each point on the mask can be found in (light on, light off).

These conventional photomasks are commonly referred to as chrome on glass (COG) binary masks, due to the binary nature of the image amplitude. The perfectly square step function exists only in the theoretical limit of the exact mask plane. At any distance away from the mask, such as in the wafer plane, diffraction effects will cause images to exhibit a finite image slope. At small dimensions, that is, when the size and spacing of the images to be printed are small relative to the $\lambda/NA$ (NA being the numerical aperture of the exposure system), electric field vectors of adjacent images will interact and add constructively. The resulting light intensity curve between the features is not completely dark, but exhibits significant amounts of light intensity created by the interaction of adjacent features. The resolution of an exposure system is limited by the contrast of the projected image, that is the intensity difference between adjacent light and dark features. An increase in the light intensity in nominally dark regions will eventually cause adjacent features to print as one combined structure rather than discrete images. As a result of the interference and processing effects which occur during pattern transfer, images formed on the device substrate deviate from their ideal dimensions and shape as represented by the computer images. These deviations depend on the characteristics of the patterns as well as a variety of process conditions. Because these deviations can significantly effect the performance of the semiconductor device, many approaches have been pursued which focus on CAD compensation schemes which ensure a resultant ideal image, such as optical proximity correction (OPC) routines.

Nonetheless, the performance enhancement of advanced VLSI circuitry (that is, the speed enhancement versus dimension reduction of the circuits) is increasingly limited by the lack of pattern fidelity in a series of lithography and RIE processes at small dimensions (e.g., sub 0.5 $\mu$m). In the photolithography process, a pattern is transferred from a photo mask to a photosensitive film (resist) on the wafer. In the RIE process, this pattern in the resist is transferred into a variety of films on the wafer substrate.

The quality with which small images can be replicated in lithography depends largely on the available process latitude; that is, the amount of allowable dose and focus variation that still results in correct image size. Phase shifted mask (PSM) lithography improves the lithographic process latitude or allows operation of a lower $k_1$ value (see equation 1) by introducing a third parameter on the mask. The electric field vector, like any vector quantity, has a magnitude and direction, so in addition to turning the electric field amplitude on and off, it can be turned on with a 0° phase or turned on with a 180° phase. This phase variation is achieved in PSMs by modifying the length that a light beam travels through the mask material. By recessing the mask by the appropriate depth, light traversing the thinner portion of the mask and light traversing the thicker portion of the mask will be 180° out of phase; that is, their electric field vectors will be of equal magnitude but point in exactly opposite directions so that any interaction between these light beams results in perfect cancellation. For more information on PSM, the reader is referred to "Phase-Shifting Mask Strategies: Isolated Dark Lines", Marc D. Levenson, *Microlithography World,* March/April 1992, pp. 6–12.

The limits of PSM lithography can be uniquely challenged by the manufacture of high-performance logic derivatives of advanced Dynamic Random Access Memory (DRAM) technologies. These technologies are entering development cycles with immediate requirements for sub-quarter micron printed gate lengths and tight dimensional control on the gate structures across large chip areas. Since these logic technologies are based on shrinking the gate length in an established DRAM technology, the overall layout pitch remains constant for all critical mask levels, resulting in narrow, optically isolated lines on the scaled gate level. The requirement for tight line width control on narrow isolated lines drives the requirement of phase edge PSMs for these logic applications.

Phase edge PSM lithography makes use of contrast enhancement caused by a phase transition under an opaque feature on a mask. This phase transition is achieved by etching an appropriate depth into the quartz mask substrate on one side of a narrow line structure on the mask. Not all narrow line structures on the mask close upon themselves, some edges of the etched region will terminate in bare quartz regions. Since the 180° phase transition forces a minimum in the image intensity, narrow dark lines will be printed by these excess phase edges. Currently, the unwanted images are erased using a trim mask, a second mask that transmits light only in regions left unexposed by the residual phase edge.

Even though resolution enhancement through the use of hard phase shifted masks (frequency doubling masks) has been extensively proven, implementation of this technique is critically dependent on computer assisted design (CAD) technology that can modify existing circuit designs to incorporate the additional design levels needed to build a phase shifted mask. Design modifications consist of defining regions on the mask that require phase shifting (i.e., by etching into the mask substrate) relative to the rest of the mask, and of designs added to eliminate lines printed by unwanted phase edges.

CAD based PSM design tools, such as the one described in U.S. Pat. No. 5,537,648, can be used to speed up the PSM design process to a point where it becomes feasible to convert entire chips to PSM designs based on specific graphical input rules. They cannot, however, guarantee that any arbitrary chip design will be able to be converted to a PSM design without phase violations.

A routine for design rule checking (DRC) of phase shifted mask (PSM) layouts is described in U.S. patent application Ser. No. 08/733,584, filed Oct. 18, 1996, and concerns identification of designed structures for which a prior knowledge of non-phase shiftability exists. The problems that arises when applying design intensive PSM techniques such as alternating or phase edge PSM to large, complex and highly integrated circuit designs is that is that the only prior definitive check for phase shiftability, is the completion of a phase shift conversion using tools such as described in U.S. Pat. No. 5,537,648. Since it is appreciated in the field that no universal solution to the alternating or phase edge design problem exists, it becomes necessary to restrict the actions of chip designers by means of design rules to ensure phaseshiftable circuitry. Due to the complexity of the PSM design problem, fail safe design rules would be extremely restrictive and result in costly design density loss.

Therefore, prior to the present invention, there remained a need for a more desirable solution that would be a CAD-based phase shiftability checker that can be utilized by designers at various stages of the chip design process to verify the phase shiftability of their designs. Alternatively, such a tool would also be extremely valuable in the derivation of PSM design rules for a specific technology generation. The lack of an efficient, easy to use phase shiftability checker requires either a prior knowledge of shapes and layouts that will fail the PSM design, as it is very risky to assume that all circumstances that can cause PSM failures have been identified and have been correctly converted to conventional DRC inputs, or it forces the PSM design tool to be used as a design checker, which is time and labor intensive and will not broad acceptance in the design community.

SUMMARY OF THE INVENTION

It is therefore an object of this invention to provide a phase shiftability checking routine that can be used to verify whether a chip layout is convertible to a phase shifted mask (PSM) design.

It is a further object of this invention to provide a phase shiftability checking routine that is widely applicable and does not require the actual design of a PSM.

According to the invention, there is provided a computationally efficient phase shiftability checking routine that is based on a concept of counting nodes that define the end points of critical dimension features in their phase interaction environment (i.e., free space).

For purposes of this application, the terminology "phase shiftability" means a design that can be converted to a phase shifted mask layout. A "critical dimension features" refers to features having a dimension requiring PSM correction. The definition of "nodes" as the end points of critical dimension features depends solely on the given lithographic process capability assumptions and can be chosen arbitrarily based on feature width or spacing. The "phase interaction environment" means free space. The definition of "free space" depends on physical requirements of the given PSM technique as well as chip design and mask processing dictated design constraints. In general, the "free space" refers to any space in the chip layout in which a phase transition would be allowable.

The present invention provides a computer-implementable routine that enables rapid location of design features that otherwise make design of an alternating phase shift mask impossible without requiring pre-determined phase shift ground rules.

The invention also solves the problem of how to rapidly check a complicated full scale chip design for ability to phase shift. The invention is very rapidly implemented and is automated to a degree that even novice chip designers having limited or no expertise in lithography still can use the invention. Additionally, in using the present invention, no particular design routine need be presumed in advance in order to develop the mask design. The invention is applicable to either a light field PSM or a dark field PSM design.

The phase shiftability checker routine of this invention is based on the concept of counting phase transitions through any free space (i.e., any two nodes will allow one phase transition for any integer number of phase transitions).

Also, the inventive phase shiftability checker routine is adapted to the design constraints of a specific PSM by redefining the nodes and free space.

Further, the inventive phase shiftability checker routine facilitates repair by giving very localized error reports even in large highly nested data sets.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 9:
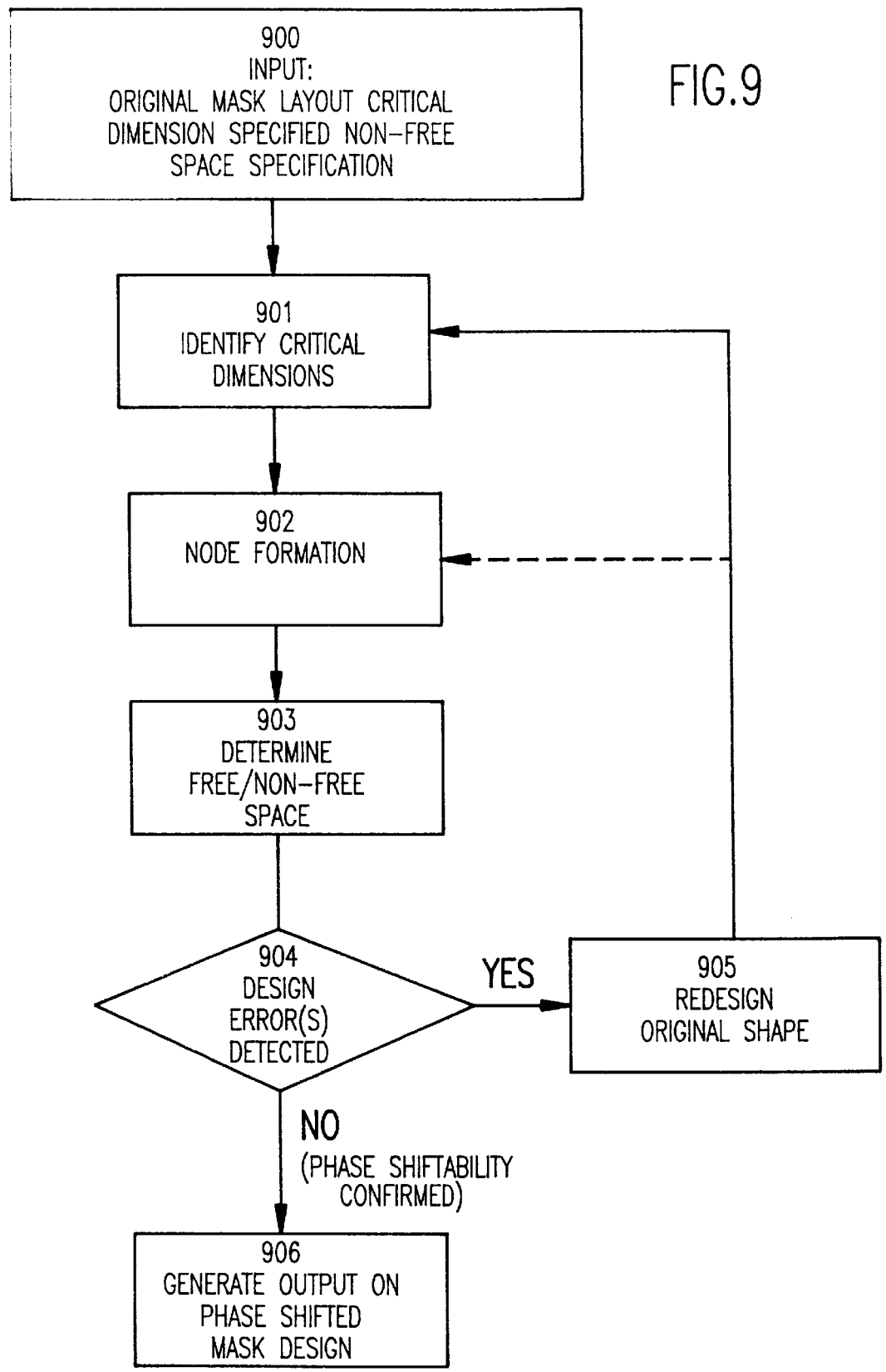
FIG. 9 is a flow diagram showing the logic of the computer implemented method of the present invention.

Referring now to the drawings, and more particularly to FIG. 9, a block flow diagram is shown that summarizes the logic of the computer implemented routine of the present invention.

Figure 1:
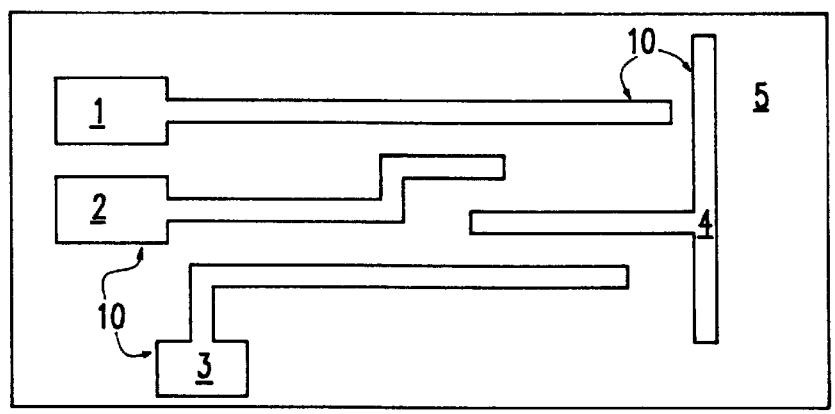
FIG. 1 is a plan view of a collection of geometric shapes constituting the layout of logic gate devices for an integrated circuit (IC) as defined in a light field mask.

The inventive routine begins in function block 900, where an arbitrary critical dimension is defined and a "non-free space", the meaning of which is developed in greater detail hereinafter, in the IC layout is established. The original layout 10 of the PSM mask design is composed of a collection of geometric shapes 1–4 at an arbitrary critical dimension, as shown in FIG. 1. It is understood that the geometric shapes 1–4 are opaque in actual implementation of the mask while the surrounding field 5 is light transmitting. The schematic of the IC layout 10 shown in FIG. 1 has the phase shiftability checking routine of the present invention applied to it in the manner described herein in order verify whether the layout can be converted to a PSM design. The general concept of the invention is exemplified on a logic gate level for sake of illustration, but the concept is equally applicable to other design levels.

Figure 2:
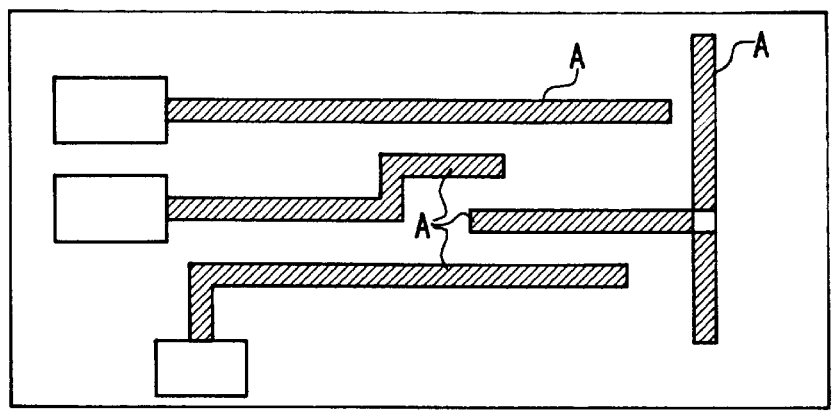
FIGS. 2, 3, and 5 to 8 are plan views illustrating the routine of confirming that the chip layout of FIG. 1 is not phase shiftable.

Next, in step 901 of the routine, critical dimension features having an arbitrary narrow dimension or smaller within the designed shapes, as shown by hatching in FIG. 2, are then identified with standard CAD techniques. For example, this step can be implemented in a CAD application, such as IBM's Hierarchical shapes processing engine "Niagara", running on a workstation, such as an IBM RISC/6000 computer. It also can be implemented in other commercially available CAD systems, such as the CADENCE layout editor by Cadence Design Systems Inc., running on any supported workstation. The identified critical dimension features are shown as "A" in FIG. 2.

Figure 3:
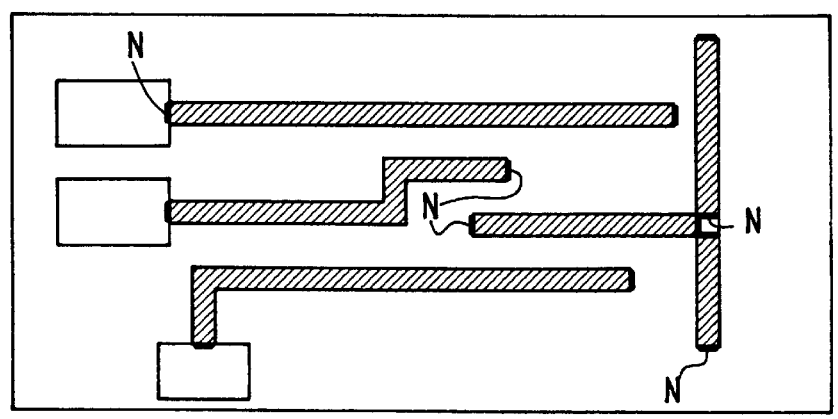

Then, in the next step 902, nodes "N" are formed at the ends of all critical dimension features "A", as shown in FIG. 3 as opaque shaded areas. Line ends are classified as short edges (<cutoff) that are bordered by two orthogonal edge pieces of a certain minimum length. In this way, an "end" of a shape can be identified and distinguished from a side edge with CAD. The nodes "N" in this case are small drawn shapes in the CAD data set, but could also be attributes in the CAD file.

Figure 5:
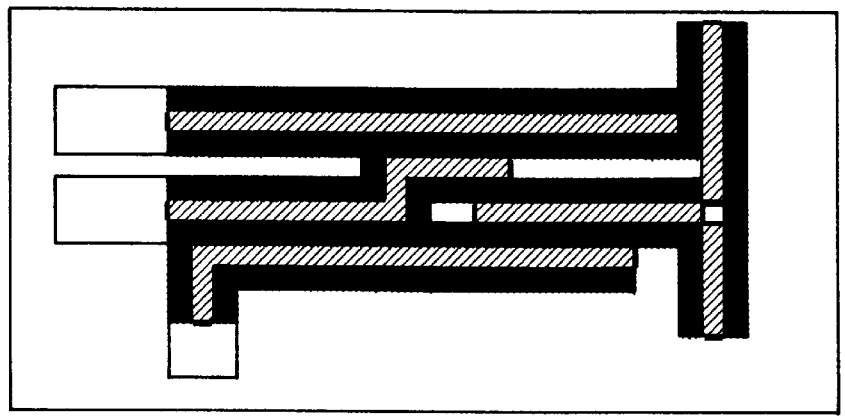
Figure 6:
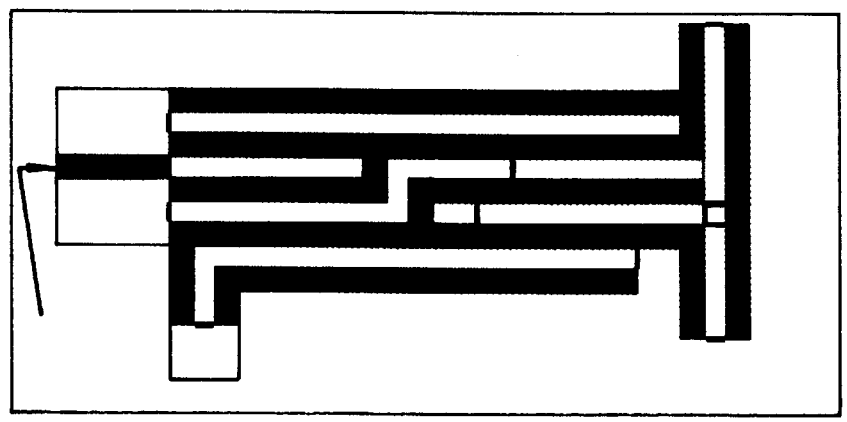

The "free space" and "non-free space" is next determined for the layout in step 903. The "free space" of the light field mask layout 10 is any space left in the chip design after subtracting all of the "non-free space" of the layout which includes those layout areas fitting into one the following categories:

a) all previously identified critical features "A";

b) a region extending out from and paralleling any feature major edge that contains one or more critical features "A", as shown in FIG. 5 with opaque shading; and c) any space that is too narrow to accommodate a means of removing the residual phase edges in the printed image (e.g., a trim mask), as shown in FIG. 6 with opaque shading. This space requirement is dictated by the resolution assumptions on the trim process and by mask and wafer overlay tolerances.

Figure 7:
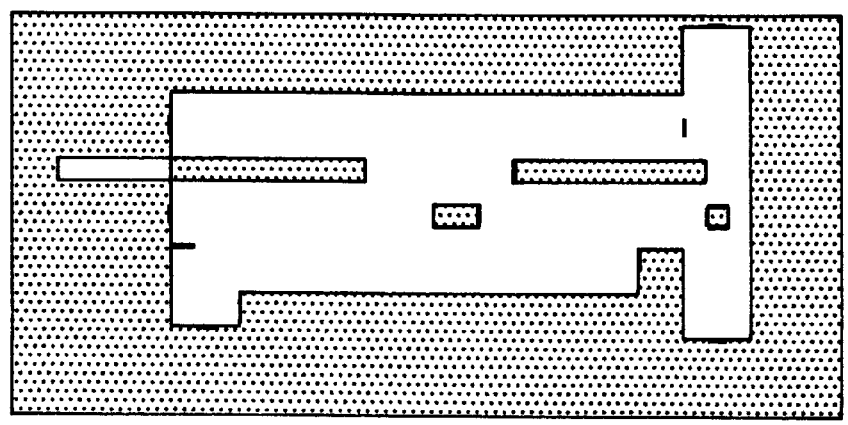

The free space in the chip design as determined by scrutinizing the layout to identify the non-free space areas as enumerated above, is shown in FIG. 7.

Figure 4:
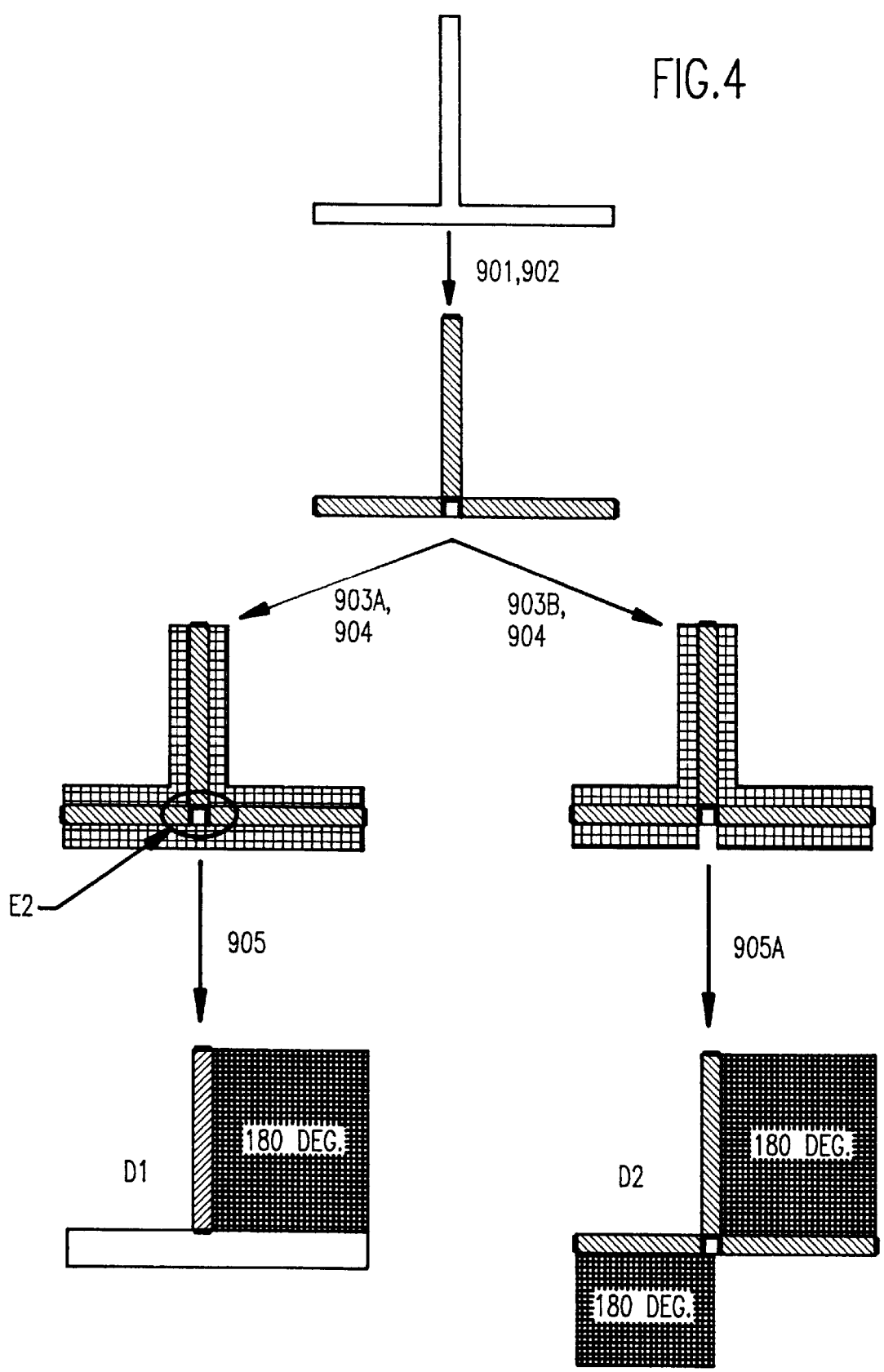
FIG. 4 is a plan view of the T shape feature of FIG. 3 having critical dimensions which is demonstrated as being checkable for phase shiftability under either of two different design constraints.

Regarding the "non-free space" determined for above item b), the particular manner of defining this category of the "non-free space" can be accomplished according to one of two different constraints, as illustrated in FIG. 4 for T-shape 4.

In steps 901 and 902, all critical dimension regions are located and the nodes are identified in the manner described hereinabove. Then, under path 903A shown in FIG. 4, the "non-free space" is defined under a constraint requiring prevention of a phase transition along any critical feature edge. This specific definition of "non-free space" is linked to a design objective of not allowing a phase transition along any continuous critical dimension features.

A less restrictive constraint for defining of "not free-space", indicated in path 903B of FIG. 4, blocks out only a zone paralleling the individual critical dimension feature segments.

Figure 8:
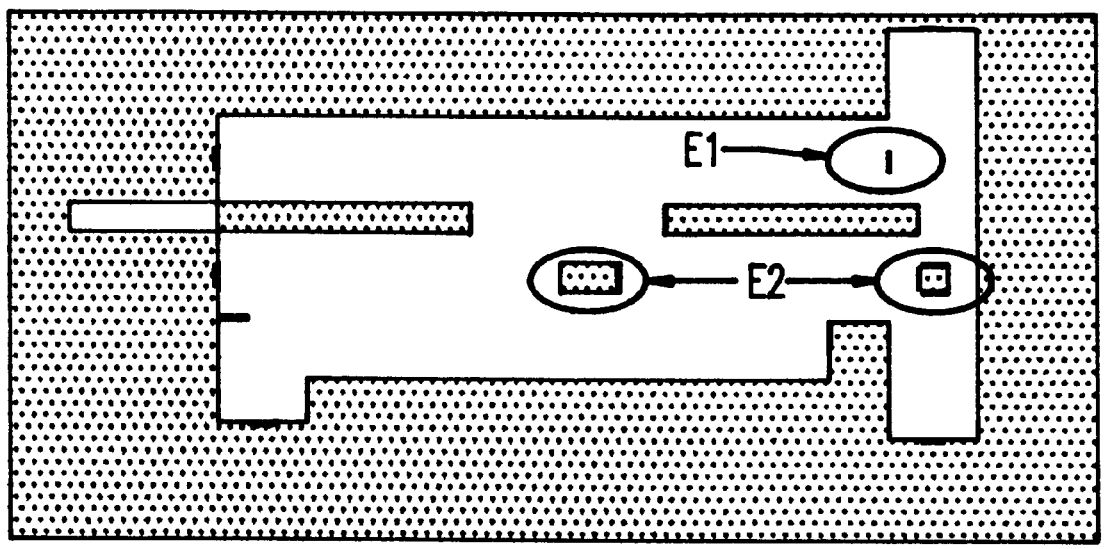

Next, in step 904, after determining the free space in either manner described above, design errors are identified and flagged. To accomplish this step, any nodes that fall into "not-free space" categories a), b), or c) described hereinabove, are flagged as PSM design errors "E1", as indicated in FIG. 8. Additionally, the nodes contained in each free space are counted. Those free spaces containing odd numbers of nodes are flagged as PSM design errors "E2", as demonstrated with respect to the T-intersection in particular in FIG. 4 and with respect to the entire layout in FIG. 8.

The more restrictive free space rules applied under path 903A will flag this "T" intersection correctly as a design error that cannot be converted to a PSM design given the stated design objectives. Next, detected design errors E1 or E2 must be eliminated in step 905 by appropriate redesign of the original layout to provide design D1. The redesigned mask layout can be iteratively checked for design errors and phase shiftability according to the inventive routine. However, in step 905A shown in FIG. 4, no errors were flagged by the node counting since the freespace in the T-junction is open to the outside. The less restrictive free space rules applied in path 903B account for the possibility of a phase transition opposite the "T", making this effectively a phase shiftable cross-shaped structure. This formulation of freespace under pathway 903B accounts for design D2. Output is generated on the mask designs having confirmed phase shiftability. The phase shifted regions are cross-hatched in designs D1 and D2 shown in FIG. 4.

As shown in FIG. 4, the different design constraints were both captured correctly by the phase shiftability checker routine of this invention. The phase shiftability checker routine of this invention is very versatile as it can correctly capture either of two different possible design constraints, as illustrated as paths 903A and 903B in FIG. 4 using the "T" intersection for simplicity of illustration in which three critical dimension features meet.

It will be understood that other design objectives and other phase shift mask techniques can be similarly captured by this checking routine by appropriately defining the specific nodes and accompanying free space.

The specific nature of the redesign depends on the overall PSM design approach, but the benefit of the disclosed checking technique is that the potential phase error is reported localized relative to the error causing design. This enables efficient manual correction of the designed shape to resolve the layout errors that cause phase variations or could localize automatic redesign efforts. Furthermore, the reported errors can be used in a process to systematically define design rules that will guarantee phaseshiftable layouts.

After redesigning the layout to address the flagged E1 and E2 errors, output is generated by computer on the phase shift mask design. Knowledge of the specific correction that was undertaken in step 905 will allow the user of ordinary skill in this art to judge a safe re-entry point into the iteration. The safe-sided checking approach would be based on re-entering at step 901 since the configuration of critical dimension features could have changed in step 905.

If no E1 or E2 errors are flagged for the layout, the circuitry layout is guaranteed to be phase shiftable and step 906 is executed wherein output is generated by computer on the phase shift mask design. Of course, it must be kept in mind that the chip layout is guaranteed to be phase shiftable if no errors are flagged provided that all design restrictions and process assumptions were used identically between the checker and the design tool and based on the assumption that any unique constraints of the design tool were correctly accounted for in checking for the phase shiftability by the specific design routine applied.

In another embodiment of the invention, the inventive phase shiftability checker routine is applied to a dark field mask.

Figure 10:
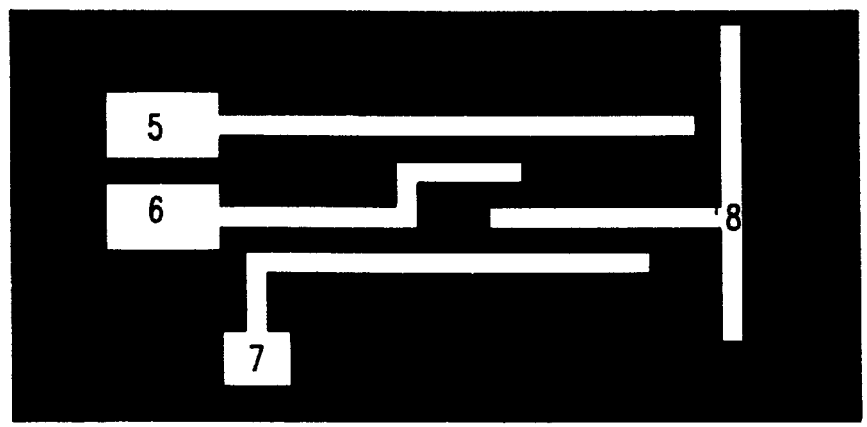
FIG. 10 is a plan view of a collection of geometric shapes constituting the layout of logic gate devices for an integrated circuit as defined in a dark field mask.

FIG. 10 is a plan view of a collection of geometric shapes constituting the layout of logic gate devices for an IC as defined by a dark field mask.

Figure 11:
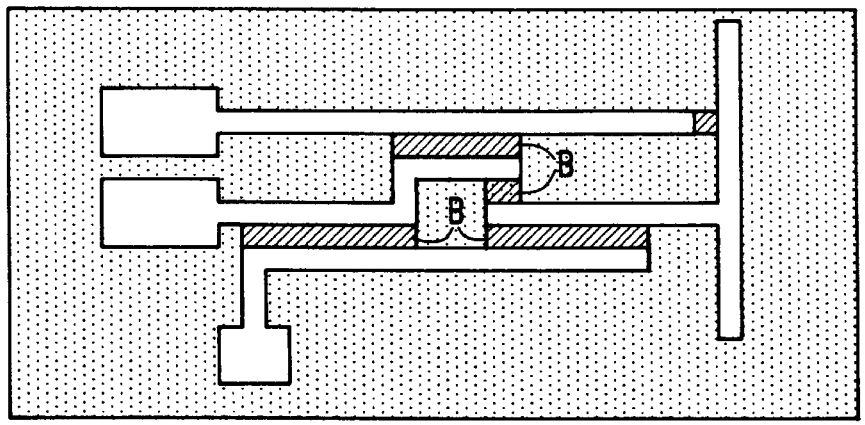
FIGS. 11, 12, and 13 are plan views illustrating the routine of confirming that the chip layout of FIG. 10 is phase shiftable.
Figure 12:
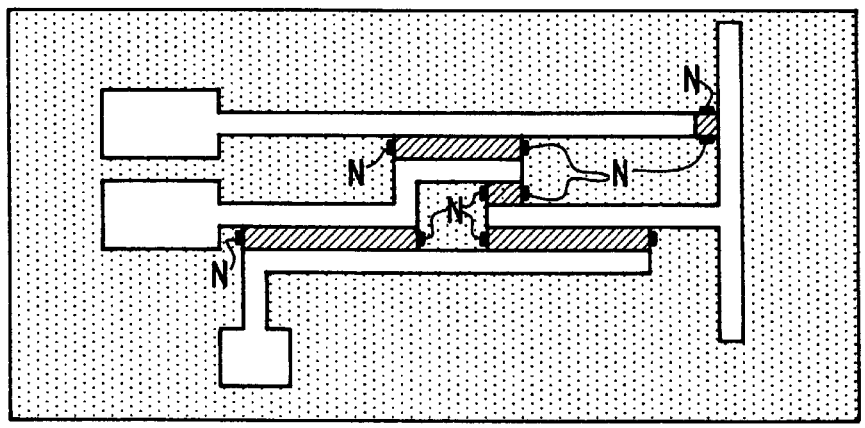
Figure 13:
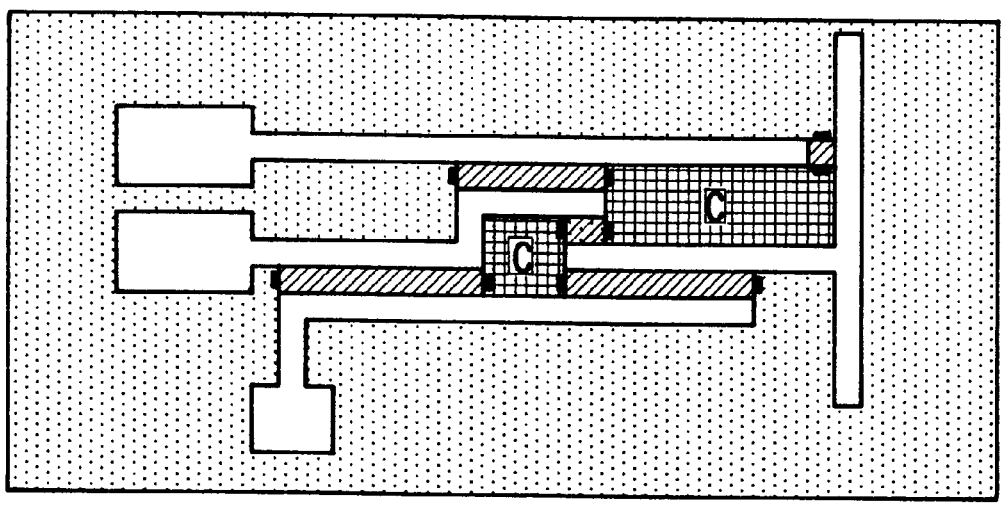

FIGS. 11, 12, and 13 are plan views illustrating the routine as applied to confirming that the chip layout defined by the dark field mask illustrated in FIG. 10 is not phase shiftable.

Generally speaking, in confirming the phase shiftability of a dark field PSM, the phase is assigned directly to the designed features which show up as transparent holes in an opaque photomask. The critical features for PSM are not designed shapes but the space between the shapes. The described phase shiftability checker can be readily adapted to verify layouts for a dark field PSM in addition to light field masks, as described above, using the same concept of counting nodes in free space. The definition of free space in this dark field embodiment depends on the specific design requirements. In a standard dark field PSM, any continuous drawn shape can only assume one phase assignment. Therefore, the only valid and acceptable phase transitions are ones that do not cross any drawn shapes. This limits the free space to any continuous background shape left after the drawn shapes and the critical features (i.e., the minimum spaces) are removed. Those skilled in the art will recognize how other specific design constraints translate into the formulation of the free space.

More specifically, the routine for verifying the phase shiftability of a layout defined by dark field PSM will proceed according to the following basic routine. FIG. 10 shows an IC layout comprised of light transmitting shapes 5–8 surrounded by a dark (opaque) field. As indicated in FIG. 11, the critical regions B' (in diagonal lines) are identified where minimum spacing occurs between shapes 5–8. Next, as shown in FIG. 12, the nodes N' are defined at the ends of the critical regions B'.

Then, as shown in FIG. 13, the problem areas are located by counting nodes N' in "free space", where "free space" is defined for this routine on a dark field layout as any continuous shape formed by the background minus the critical Regions B'. As indicated in FIG. 13, two dark shaded areas C are enclosed (bounded on all sides) by critical regions and layout shapes, and these shaded areas C constitute the problem areas.

From this point, the routine for the dark field mask then proceeds in the same manner as described above for the light field mask. That is, the free spaces containing odd numbers of counted nodes, the problem areas C, are flagged as PSM design errors. Any detected design errors in this manner are then eliminated by appropriate redesign of the original layout. Again, the specific nature of the redesign depends on the overall PSM design approach.

After redesigning the layout to address the flagged errors, output is generated by computer on the phase shift mask design. Knowledge of the specific correction that was undertaken will again allow the user of ordinary skill in this art to judge a safe re-entry point into the iteration.

If no errors are flagged for the layout, the circuitry layout is guaranteed to be phase shiftable and is executed wherein output is generated by computer on the phase shift mask design.

While the invention has been described in terms of a several embodiments, those skilled in the art will recognize that the invention can be practiced with modification within the spirit and scope of the appended claims. The computer-implemented routine of this invention used to verify an existing chip design can be converted to a PSM at other mask levels and it is not limited merely to gate levels.

Having thus described my invention, what we claim as new and desire to secure by Letters Patent is as follows:

1. A computer-implemented routine for checking the phase shiftability of a mask design from existing circuit design data by a computer, comprising the steps of:

(a) inputting the existing circuit design data to the computer together with predefined input parameters;

(b) scanning by the computer the existing circuit design data to locate critical features;

(c) forming nodes at ends of said critical features;

(d) determining free space and non-free space for said existing circuit layout, said free space being any region in said mask design that is allowed to contain a phase transition;

(e) detecting PSM design errors by identifying:
   (i) any nodes that fall into said not-free space, and
   (ii) by counting the number of nodes contained in each free space wherein free spaces containing an odd numbers of nodes are identified as PSM design errors,
   wherein if no PSM design errors are detected said circuit pattern has phase shiftability confirmed, and, otherwise;

(f) eliminating any detected design errors in the existing circuit design by redesign to provide a circuit pattern having phase shiftability confirmed; and (g) generating computer output on the circuit design having confirmed phase shiftability.

2. The computer-implemented routine as in claim 1, wherein said phase-shifted mask design is a light field mask.

3. A computer-implemented routine for checking the phase shiftability of a phase-shifted mask design from existing circuit design data by a computer, comprising the steps of:

(a) inputting the existing circuit design data to the computer together with predefined input parameters;

(b) scanning by the computer the existing circuit design data to locate features of the circuit data having a dimension less than a predefined critical dimension;

(c) forming nodes at ends of said critical dimension features;

(d) determining free space and non-free space for said existing circuit layout, said free space being the space left in the chip design after subtracting all non-free space of said layout, said non-free space being composed of all areas of said existing circuit layout satisfying at least one condition selected from the group consisting of (i) areas represented by a critical dimension feature, (ii) regions extending out from and paralleling any major edge of a critical dimension feature, and (iii) any spaces being of insufficient dimension to accommodate a trim mask means for removing the residual phase edges in the printed image;

(e) detecting PSM design errors by identifying:
   (i) any nodes that fall into said not-free space, and
   (ii) by counting the number of nodes contained in each free space, wherein free spaces containing an odd numbers of nodes are identified as PSM design errors,
   wherein if no PSM design errors are detected said circuit pattern has phase shiftability confirmed, and, otherwise;

(f) eliminating any detected design errors in the existing circuit design by redesign;

(g) returning to step (b) or step (c); and (h) generating computer output on the circuit design having confirmed phase shiftability.

4. The computer-implemented routine as in claim 3, wherein said phase-shifted mask design is a light field mask.

5. The computer-implemented routine as in claim 3, wherein step (b) is returned to upon completion of step (g).

6. A computer-implemented routine for checking the phase shiftability of a phase-shifted mask design from existing circuit design data by a computer, comprising the steps of:

(a) inputting the existing circuit design data comprised of a layout shapes to the computer together with predefined input parameters;

(b) scanning by the computer the existing circuit design data to locate critical regions defined by areas of minimum spacing between said layout shapes;

(c) forming nodes at ends of said critical regions;

(d) determining free space for said existing circuit layout, said free space being any continuous shape formed by removing said critical regions from the background;

(e) detecting PSM design errors by counting the number of nodes contained in each free space wherein free spaces containing an odd numbers of nodes are identified as PSM design errors, wherein if no PSM design errors are detected said circuit pattern has phase shiftability confirmed, and, otherwise;

(f) eliminating any detected design errors in the existing circuit design by redesign;

(g) returning to step (b) or step (c); and (h) generating computer output on the circuit design having confirmed phase shiftability.

7. The computer-implemented routine as in claim 6, wherein said phase-shifted mask design is a dark field mask.

8. The computer-implemented routine as in claim 6, wherein step (b) is returned to upon completion of step (g).

* * * * *